(12) United States Patent
Tain et al.

(10) Patent No.: US 9,368,442 B1
(45) Date of Patent: Jun. 14, 2016

(54) METHOD FOR MANUFACTURING AN INTERPOSER, INTERPOSER AND CHIP PACKAGE STRUCTURE

(71) Applicant: Unimicron Technology Corp., Taoyuan (TW)

(72) Inventors: Ra-Min Tain, Hsinchu County (TW); Dyi-Chung Hu, Hsinchu County (TW); Yu-Hua Chen, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/583,755

(22) Filed: Dec. 28, 2014

(51) Int. Cl.
| | | |
|---|---|---|
| *H01L 23/498* | (2006.01) | |
| *H01L 21/48* | (2006.01) | |
| *H01L 21/3105* | (2006.01) | |

(52) U.S. Cl.
CPC .... *H01L 23/49827* (2013.01); *H01L 21/31051* (2013.01); *H01L 21/486* (2013.01); *H01L 21/4864* (2013.01); *H01L 23/49833* (2013.01); *H01L 23/49838* (2013.01); *H01L 23/49894* (2013.01)

(58) Field of Classification Search
CPC .............. H01L 23/48; H01L 23/49827; H01L 23/49838; H01L 21/486
See application file for complete search history.

(56) References Cited

U.S. PATENT DOCUMENTS

| | | | | |
|---|---|---|---|---|
| 6,531,770 B2 * | 3/2003 | Nakashima | ........... | H01L 21/565 257/704 |
| 8,344,490 B2 * | 1/2013 | Aiba | ................... | H01L 23/5384 257/686 |
| 8,405,213 B2 * | 3/2013 | Chen | ........................ | H01L 25/16 257/685 |
| 2001/0008309 A1 * | 7/2001 | Iijima | ............... | H01L 21/76885 257/737 |
| 2006/0118941 A1 * | 6/2006 | Lai | ........................ | H01L 21/561 257/698 |
| 2007/0114662 A1 * | 5/2007 | Helneder | ................. | H01L 24/11 257/737 |
| 2010/0289140 A1 * | 11/2010 | Sunohara | ............ | H01L 21/6835 257/737 |
| 2012/0092834 A1 * | 4/2012 | Tain | .................... | H01L 23/3735 361/717 |
| 2012/0153454 A1 * | 6/2012 | Liu | ......................... | H01L 23/38 257/712 |
| 2012/0273939 A1 * | 11/2012 | Dai | ................... | H01L 21/76898 257/737 |
| 2013/0119555 A1 | 5/2013 | Sundaram et al. | | |
| 2013/0168841 A1 | 7/2013 | Zhao et al. | | |

* cited by examiner

*Primary Examiner* — Nathan Ha
(74) *Attorney, Agent, or Firm* — Jianq Chyun IP Office

(57) ABSTRACT

A method for manufacturing an interposer includes the following steps. Conductive beads is filled in a blind via of a substrate and a solder layer of each conductive bead is melted so as to form a solder post in the blind via. A metal ball of each conductive bead is inlaid in the corresponding solder post such that the solder post and the metal balls inlaid therein construct a conductive though via. Two surfaces of the substrate are planarized such that two ends of the conductive through via are exposed to the two surfaces of the substrate respectively and are flush with the two surfaces of the substrate respectively. A redistribution layer is manufactured at each surface of the substrate such that the two ends of each conductive through via connect the redistribution layers respectively. Besides, an interposer and a chip package structure applied the interposer are also provided.

13 Claims, 3 Drawing Sheets

METHOD FOR MANUFACTURING AN INTERPOSER, INTERPOSER AND CHIP PACKAGE STRUCTURE

BACKGROUND OF THE DISCLOSURE

1. Field of the Disclosure

The disclosure relates to a chip package technology, and more particularly to an interposer applied to the chip package technology and a method for manufacturing the same.

2. Description of Related Art

Semiconductor integrated circuit (IC) industry includes IC fabrication and IC packaging. IC fabrication is manufacturing integrated circuits on wafers. The IC packaging may provide structure protection, electrical transmission and good heat dissipation to the chip (i.e., a portion of the wafer after cut) in which IC has been fabricated thereto.

Flip chip bonding technology is a sort of chip package technology and often applied to the bonding between the chip and the package carrier. Specifically, the active surface (the side having active device) of the chip may be connected to the top surface of the package carrier through a plurality of conductive bumps. Then, the bottom surface of the package carrier may be connected to the printed circuit board (PCB) through conductive balls.

However, the speed of the increase of the contact density of the chip becomes gradually larger than the speed of the increase of the contact density of the package carrier, resulting that a drop height exists between the contact density of the chip and the contact density of the package carrier. In order to slow down the drop height, interposers are developed. An interposer is a signal transmission medium disposed between a chip and a package carrier.

SUMMARY OF THE DISCLOSURE

The disclosure provides a method for manufacturing an interposer, for manufacturing an interposer.

The disclosure provides an interposer, used as a signal transmission medium between a chip and a package carrier or a printed circuit board.

The disclosure provides a chip package structure which employs an interposer which serves as a signal transmission medium between a chip and a package carrier.

The method of manufacturing an interposer of the disclosure includes the following steps. A substrate is provided. The substrate has a first surface, a second surface opposite to the first surface, and a plurality of blind vias recessed into the first surface. The blind vias are filled with a plurality of conductive beads, so that each of the blind vias has the plurality of conductive beads. Each of the conductive beads includes a metal ball and a solder layer enclosing the metal ball. The solder layers are melted, so that a plurality of solder posts are formed in the blind vias. The metal balls are inlaid in the corresponding solder post, and each of the solder posts and the metal balls inlaid therein construct a conductive through via. The first surface of the substrate is planarized, such that a first end, close to the first surface, of each of the conductive through via is flush with the first surface of the substrate. A portion of the substrate is removed from the second surface of the substrate till a second end, close to the second surface, of each of the conductive through vias is exposed to the second surface of the substrate and is flush with the second surface of the substrate. After the first surface of the substrate is planarized, a first redistribution layer is manufactured at the first surface of the substrate, wherein the first redistribution layer is electrically connected to the first end of each of the conductive through vias. After the portion of the substrate is removed from the second surface of the substrate, a second redistribution layer is manufactured at the second surface of the substrate, wherein the second redistribution layer is electrically connected to the second end of each of the conductive through vias.

An interposer of the disclosure includes a substrate, a plurality of conductive through vias, a first redistribution layer and a second redistribution layer. The substrate has a first surface and a second surface opposite to the first surface. Each of the conductive through vias passes through the substrate and connects the first surface and the second surface. Each of the conductive through vias has a first end and a second end, the first end is exposed at the first surface of the substrate and is flush with the first surface of the substrate, the second end is exposed at the second surface of the substrate and is flush with the second surface of the surface, each of the conductive through vias includes a solder post and a plurality of metal balls, and the metal balls are inlaid in the corresponding solder post. The first redistribution layer is disposed at the first surface of the substrate and electrically connected to the first end of each of the conductive through vias. The second redistribution layer is disposed at the second surface of the substrate and electrically connected to the second end of each of the conductive through vias.

A chip package structure of the disclosure includes a chip, a package carrier and the interposer. The interposer is located between the chip and the package carrier. The chip is disposed at the first redistribution layer and the second redistribution layer is disposed at the package carrier.

In light of the above, in the disclosure, by way of filling a plurality of conductive beads into the blind vias and melting the solder layer of each of the conductive beads, the solder posts are formed in the blind vias. The metal ball of each of the conductive beads are inlaid in the corresponding solder post, so that each of the solder posts and the metal balls inlaid therein construct a conductive through via. By way of planarizing the first surface of the substrate, the two ends of each of the conductive through vias are exposed to the two surfaces of the substrate and are flush with the two surfaces, respectively. By way of manufacturing a redistribution layer on each surface of the substrate, the two ends of each of the conductive through vias are connected to the redistribution layers, respectively.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
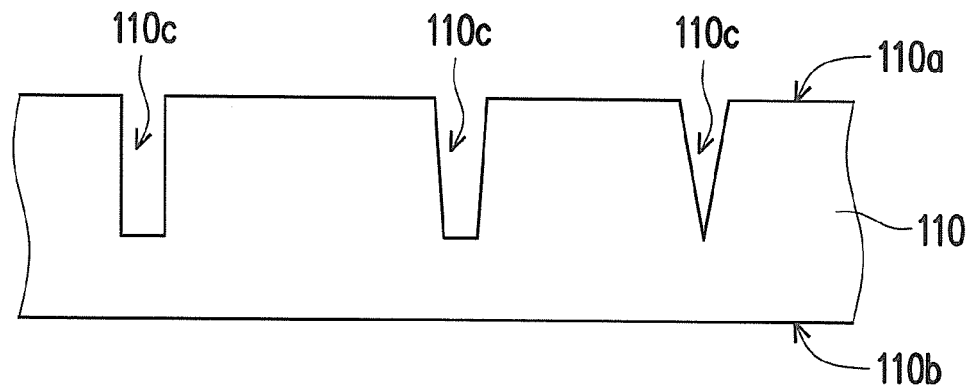
FIG. 1A through FIG. 1F are schematic views depicting a method for manufacturing an interposer according to one exemplary embodiment of the disclosure.

Referring to FIG. 1A, in the method for manufacturing an interposer of this embodiment, a substrate 110 is provided first. The substrate 110 has a first surface 110a, a second surface 110b opposite to the first surface 110a, and a plurality of blind vias 110c recessed into the first surface 110a. In the embodiment, the shapes of the blind vias 110c may be straight cylindrical shape, truncated pyramid shape, or pyramid shape, and they are illustrated as the blind vias 110c in the left, middle, and right of FIG. 1A, respectively. Furthermore, a material of the substrate 110 includes, for example, glass, ceramic, polymer material, or silicon. If the material of the substrate 110 includes silicon, the inner surfaces of the blind vias 110c may need extra insulating process.

Figure 1B:
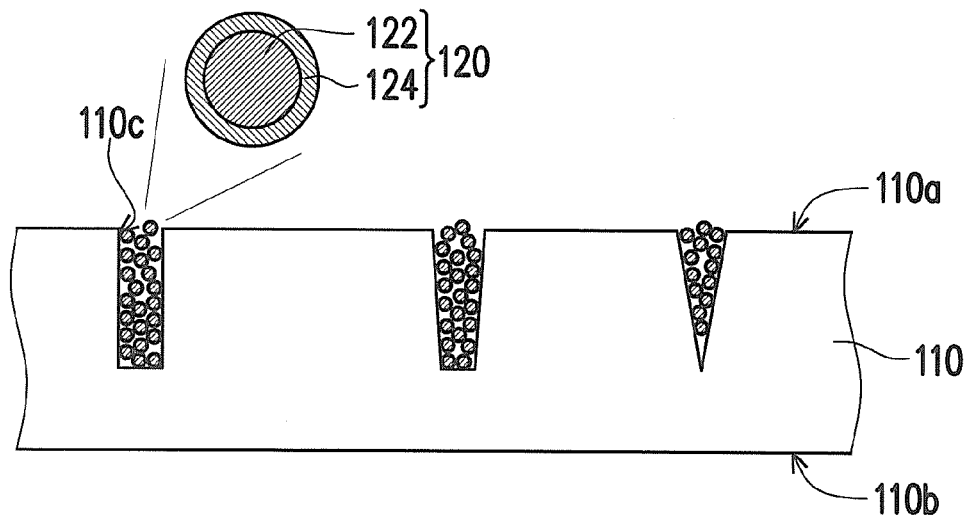

Referring to FIG. 1B, the blind vias 110c are filled with a plurality of conductive beads 120, so that each of the blind vias 110c has the plurality of conductive beads 120. It should be noted that, each of the conductive beads 120 includes a metal ball 122 (e.g., copper ball) and a solder layer 124 enclosing the metal ball 122. In the embodiment, the outer diameter of each of the metal balls 122 may range from 0.5 μm to 10 μm, but the disclosure is not limited thereto.

Figure 1C:
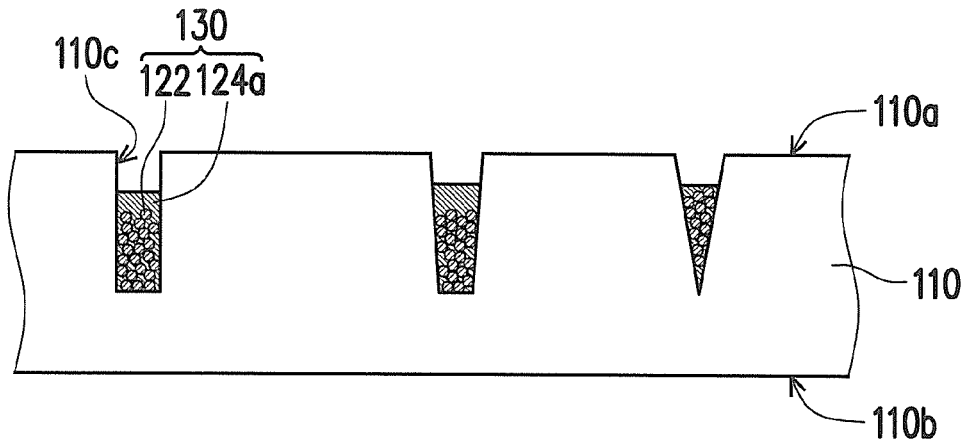

Referring to FIG. 1C, the solder layers 124 are melted, so that a plurality of solder posts 124a are formed in the blind vias 110c. The melting point of the metal balls 122 is larger than the melting point of the solder layers 124. Therefore, when the solder layers 124 are melted, the metal balls 122 still remain solid state. Thus, the metal balls 122 are inlaid in the corresponding solder post 124a. Each of the solder posts 124a and the metal balls 122 inlaid therein construct a conductive through via 130.

Figure 1D:
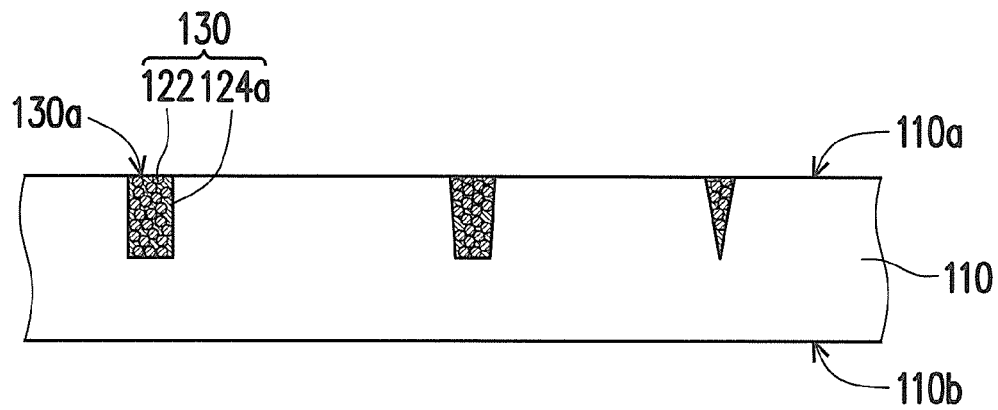

Referring to FIG. 1D, the first surface 110a of the substrate 110 is planarized, such that the first end 130a, close to the first surface 110a, of each of the conductive through vias 130 is flush with the first surface 110a of the substrate 110. The metal ball 122s close to the first surface 110a of the substrate 110 are shaved, so as to be flush with the first surface 110a of the substrate 110. In the embodiment, the way of planarizing the substrate 110 may be chemical-mechanical polishing (CMP) process, but the disclosure is not limited thereto.

Figure 1E:
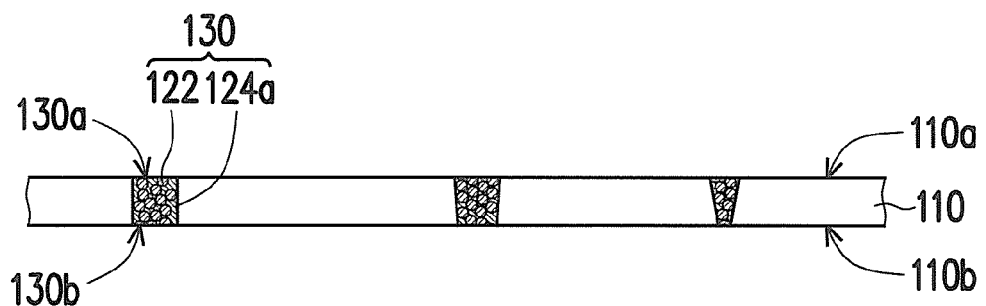

Referring to FIG. 1E, a portion of the substrate 110 is removed from the second surface 110b of the substrate 110 till the second end 130b, close to the second surface 110b, of each of the conductive through vias 130 is exposed to the second surface 110b of the substrate 110 and is flush with the second surface 110b of the substrate 110. In the embodiment, the metal balls 122 close to the second surface 110b of the substrate 110 are shaved. The outer diameter of each of the conductive through vias 130 may range from 5 μm to 100 μm, but the disclosure is not limited thereto.

Referring to FIG. 1E again, according to the initial shapes (truncated pyramid shape and pyramid shape) of the blind vias 110c in the middle and right of FIG. 1A and after the steps of FIG. 1A to FIG. 1E, the middle and right conductive through vias 130 are convergent from the first end 130a toward the second end 130b. Therefore, the ratio of the outer diameter of the second end 130b of each of the conductive through vias 130 to the outer diameter of the corresponding first end 130a may range from 0.3 to 1. In other words, the outer diameter of the second end 130b may be 30% to 100% of the outer diameter of the first end 130a, but the disclosure is not limited thereto.

Figure 1F:
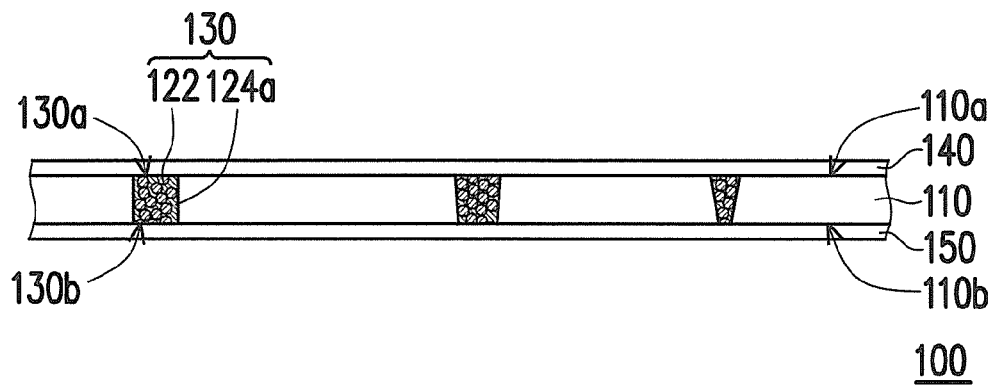

Referring to FIG. 1F, after the first surface 110a of the substrate 110 is planarized, a first redistribution layer 140 is manufactured at the first surface 110a of the substrate 110, wherein the first redistribution layer 140 is electrically connected to the first end 130a of each of the conductive through vias 130. The first redistribution layer 140 may be a single layer circuit or a multi layer circuit.

Referring to FIG. 1F again, after the portion of the substrate 110 is removed from the second surface 110b of the substrate 110, a second redistribution layer 150 is manufactured at the second surface 110b of the substrate 110, wherein the second redistribution layer 150 is electrically connected to the second end 130b of each of the conductive through vias 130. The second redistribution layer 150 may be a single layer circuit or a multi layer circuit. In the embodiment, the interposer 100 includes a substrate 110, the conductive through vias 130, the first redistribution layer 140 and the second redistribution layer 150.

Figure 2:
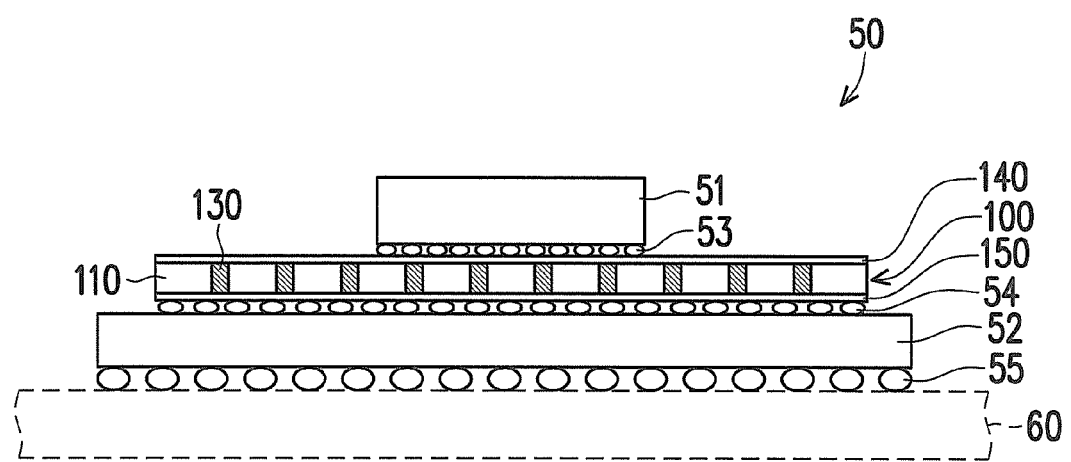
FIG. 2 is a schematic view illustrating a chip package structure is disposed on a printed circuit board according to another exemplary embodiment of the disclosure.

Referring to both FIG. 1F and FIG. 2, a chip package structure 50 of another embodiment includes a chip 51, a package carrier 52 and the abovementioned interposer 100 shown in FIG. 1F. The interposer 100 is located between the chip 51 and the package carrier 52. The number of the chips 51 is not limited to be one, may also be plural. The chip 51 may be disposed at the first redistribution layer 140 of the interposer 100 through a plurality of conductive bumps 53. The second redistribution layer 150 of the interposer 100 may be disposed at the package carrier 52 through a plurality of conductive bumps 54. The package carrier 52 may be disposed to the printed circuit board 60 through a plurality of conductive balls 55. Therefore, the chip 51 may be electrically connected to the printed circuit board 60 (e.g., mother board or module board) sequentially through the interposer 100 and the package carrier 52. In another embodiment which is not shown in the drawings, the packager carrier 52 may be omitted, so that the chip 51 may directly electrically connected to the printed circuit board 60 through the interposer 100.

In light of the foregoing, in the disclosure, by way of filling a plurality of conductive beads into the blind vias and melting the solder layer of each of the conductive beads, the solder posts are formed in the blind vias. The metal ball of each of the conductive beads are inlaid in the corresponding solder post, so that each of the solder posts and the metal balls inlaid therein construct a conductive through via. By way of planarizing the first surface of the substrate, the two ends of each of the conductive through vias are exposed to the two surfaces of the substrate and are flush with the two surfaces, respectively. By way of manufacturing a redistribution layer on each surface of the substrate, the two ends of each of the conductive through vias are connected to the redistribution layers, respectively. In addition, in the disclosure, since the conventional electroplating method is replaced with employing conductive beads to form the conductive through vias, the production speed may be increased.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A method of manufacturing an interposer, comprising:
providing a substrate, wherein the substrate has a first surface, a second surface opposite to the first surface, and a plurality of blind vias recessed into the first surface;
filling the blind vias with a plurality of conductive beads, so that each of the blind vias has the plurality of conductive beads, wherein each of the conductive beads comprises a metal ball and a solder layer enclosing the metal ball;
melting the solder layers, so as to form a plurality of solder posts in the blind vias, wherein the metal balls are inlaid in the corresponding solder posts, and each of the solder posts and the metal balls inlaid therein construct a conductive through via;

planarizing the first surface of the substrate, such that a first end, close to the first surface, of each of the conductive through vias is flush with the first surface of the substrate;

removing a portion of the substrate from the second surface of the substrate till a second end, close to the second surface, of each of the conductive through vias is exposed to the second surface of the substrate and is flush with the second surface of the substrate;

after the first surface of the substrate is planarized, manufacturing a first redistribution layer at the first surface of the substrate, wherein the first redistribution layer is electrically connected to the first end of each of the conductive through vias; and after the portion of the substrate is removed from the second surface of the substrate, manufacturing a second redistribution layer at the second surface of the substrate, wherein the second redistribution layer is electrically connected to the second end of each of the conductive through vias.

2. The method of manufacturing an interposer as claimed in claim 1, wherein a melting point of the metal balls is larger than a melting point of the solder layers.

3. The method of manufacturing an interposer as claim in claim 1, wherein in the step of planarizing the first surface of the substrate, the metal ball close to the first surface of the substrate is shaved, and in the step of removing the portion of the substrate from the second surface of the substrate, the metal ball close to the second surface of the substrate is shaved.

4. The method of manufacturing an interposer as claim in claim 1, wherein in the step of removing the portion of the substrate from the second surface of the substrate, the metal ball close to the second surface of the substrate is shaved.

5. An interposer, comprising:
a substrate having a first surface and a second surface opposite to the first surface; and
a plurality of conductive through vias, wherein each of the conductive through vias passes through the substrate and connects the first surface and the second surface, each of the conductive through vias has a first end and a second end, the first end is exposed at the first surface of the substrate and is flush with the first surface of the substrate, the second end is exposed at the second surface of the substrate and is flush with the second surface of the surface, each of the conductive through vias comprises a solder post and a plurality of metal balls, and the metal balls are inlaid in the corresponding solder post;
a first redistribution layer disposed at the first surface of the substrate and electrically connected to the first end of each of the conductive through vias; and a second redistribution layer disposed at the second surface of the substrate and electrically connected to the second end of each of the conductive through vias.

6. The interposer as claimed in claim 5, wherein a melting point of the metal balls is larger than a melting point of the corresponding solder layer.

7. The interposer as claimed in claim 5, wherein a material of the substrate comprises glass, ceramic, polymer material, or silicon.

8. The interposer as claim in claim 5, wherein the metal ball close to the first surface of the substrate is shaved, so as to be flush with the first surface of the substrate, and the metal ball close to the second surface of the substrate is shaved, so as to be flush with the second surface of the substrate.

9. The interposer as claimed in claim 5, wherein an outer diameter of each of the conductive through vias ranges from 5 μm to 100 μm.

10. The interposer as claimed in claim 5, wherein an outer diameter of each of the metal balls ranges from 0.5 μm to 10 μm.

11. The interposer as claimed in claim 5, wherein each of the conductive through vias is convergent from the first end toward the second end.

12. The interposer as claimed in claim 5, wherein a ratio of an outer diameter of the second end of each of the conductive through vias to an outer diameter of the corresponding first end ranges from 0.3 to 1.

13. A chip package structure, comprising:
a chip;
a package carrier; and
an interposer located between the chip and the package carrier, and comprising:
a substrate having a first surface and a second surface opposite to the first surface;
a plurality of conductive through vias, wherein each of the conductive through vias passes through the substrate and connects the first surface and the second surface, each of the conductive through vias has a first end and a second end, the first end is exposed at the first surface of the substrate and is flush with the first surface of the substrate, the second end is exposed at the second surface of the substrate and is flush with the second surface of the surface, each of the conductive through vias comprises a solder post and a plurality of metal balls, and the metal balls are inlaid in the corresponding solder post;
a first redistribution layer disposed at the first surface of the substrate and electrically connected to the first end of each of the conductive through vias, wherein the chip is disposed at the first redistribution layer; and
a second redistribution layer disposed at the second surface of the substrate and electrically connected to the second end of each of the conductive through vias, wherein the second redistribution layer is disposed at the package carrier.

* * * * *